METHOD OF FABRICATING THIN FILM DEVICE HAVING CLOSE SPACED ELECTRODES

Original Filed Aug. 17, 1961 6 Sheets-Sheet 1

INVENTOR.
PAUL K. WEIMER
BY
[signature]
Attorney

INVENTOR.
PAUL K. WEIMER
BY
[signature]
Attorney

INVENTOR.
PAUL K. WEIMER
BY Glenn H. Bruestle
Attorney

INVENTOR.
PAUL K. WEIMER
BY
Glenn H. Bruestle
Attorney

INVENTOR.
PAUL K. WEIMER
BY
Glenn H. Bruestle
Attorney

INVENTOR.
PAUL K. WEIMER
BY
Glenn H. Bruestle
Attorney

United States Patent Office 3,385,731

Patented May 28, 1968

3,385,731

METHOD OF FABRICATING THIN FILM DEVICE HAVING CLOSE SPACED ELECTRODES

Paul Kessler Weimer, Princeton, N.J., assignor to Radio Corporation of America, a corporation of Delaware Original application Aug. 17, 1961, Ser. No. 132,095, now Patent No. 3,258,663. Divided and this application Nov. 3, 1965, Ser. No. 506,162

2 Claims. (Cl. 117—212)

This application is a division of application Ser. No. 132,095, filed Aug. 17, 1961, and now patent No. 3,258,663.

This invention relates to improved solid state electrical devices and improved methods of fabricating them. More particularly, one aspect of the invention relates to improved thin film solid state electrical devices capable of operating in the current enhancement mode.

In the current enhancement mode of operation, the charge carrier density of a semiconductor is increased by the application of an electric field transversely to the semiconductor. It has been proposed that it is theoretically possible to make a parallel plate condenser in which one plate is a semiconductor layer, and to vary the conductivity of the semiconductor layer by varying the charge on the condenser. See for example section 2.1*b*, pages 29–31 of W. Shockley, Electrons and Holes in Semiconductors, D. Van Nostrand Company, Inc., New York 1950. Experiments have been reported in which the conductivity of thin layers of semiconductors such as germanium, silicon and copper oxide have been modulated by means of a surface charge. See for example Shockley and Pearson, Physical Review 72, 1948, pages 232–233, wherein the experimental arrangement comprises a parallel plate condenser formed by evaporating gold on one side and a semiconductor on the opposite side of a slab of used quartz three mils thick. Two electrodes are attached to the ends of the semiconductor, and a steady current is passed between the two electrodes. The variation of this current is used to measure the variation of conductivity of the semiconductor layer when the charge on the condenser is varied. This arrangement was used to measure various physical properties of the semiconductor, such as the number of surface states per unit area and voltage. Other experiments have been performed in which the conductivity of a semiconductor such as zinc oxide is modulated by making the semiconductor one plate of a condenser. See for example FIGURE 2 of G. Heiland, J. Phys. Chem. Solids, volume 6, 1958, pages 158–168, wherein an experimental arrangement is described in which two electrodes are connected to the opposite ends of a zinc oxide crystal, and a steady battery potential is applied between the two electrodes. A mica sheet about 0.1 mm. thick is placed on one face of the zinc oxide crystal, and a field electrode is positioned against that side of a mica sheet which is opposite the zinc oxide. Next a potential of about 1000 volts is applied to the field electrode and the change in the conductivity of the zinc oxide crystal is measured by an electrometer. Since the field electrode and the mica sheet in this experiment set up are heated in vacuum to 650° K. before each measurement, and in both of these experiments high control voltages produce only small changes in the conductivity of the semiconductor, these devices are not as efficient as desirable. Even if thinner quartz slabs or thinner mica sheets were utilized, the separation between the two plates of the condenser would be too great for an efficient device.

Attempts have also been made to modulate the conductivity of a semiconductor such as zinc oxide by using a highly conducting liquid electrolyte in direct contact with the semiconductor to apply the modulating potential field. See for example J. F. De Wald, B.A.P.S., 1958, page 129. As in the previous experiment, two electrodes are attached to the ends of the zinc oxide crystal, and a current is passed between them. When a positive potential is applied to the liquid electrolyte, sufficient electrons are drawn into the zinc oxide from the electrodes which contact it to "swamp out" the effect of traps in the zinc oxide, and to increase the conductivity of the zinc oxide crystal. However, this arrangement requires maintaining a liquid electrolyte in contact with the zinc oxide and hence is unsatisfactory for many applications, where reliability and good shelf life require that entirely solid state devices be utilized. Highly reliable solid state devices with good shelf life and operating in the current enhancement mode have not hitherto been reported.

It is an object of this invention to provide improved solid state devices.

Another object is to provide active solid state devices which can be prepared entirely by deposition of thin films upon an insulating substrate or support.

Still another object is to provide novel and practical solid state devices capable of operating in the current enhancement mode.

Yet another object is to provide improved methods of fabricating the improved devices according to the invention.

These and other objects are attained according to the invention by providing a solid state electrical device or circuit element comprising a layer of semiconductive material having at least two spaced electrodes thereon. A thin film of a high resistivity material having a bandgap greater than that of the semiconductive layer is deposited on at least a portion of the layer. The film consists of a material selected from the group consisting of insulators and wide gap semiconductors which exhibit high resistivity and is preferably less than two microns thick. At least one control contact is made on the thin film, which hereinafter and in the claims is termed a wide-gap film. The control contact may be described as an insulating contact to the semiconductor layer, and preferably extends over at least a part of the gap between the two spaced electrodes. The assemblage consisting of the semiconductor layer, the two spaced electrodes, the film of material having a bandgap greater than that of the semiconductive layer, and the control contact may be supported by an insulating substrate.

It is a feature of the invention that the devices thus fabricated are all capable of operating in the current enhancement mode.

Another feature of the devices according to the invention is that the semiconductor layer utilized is of a single conductivity type and does not require the fabrication of PN junctions.

Still another feature is that the electrical devices according to the invention may be fabricated by the successive deposition of thin films.

The invention will be described in greater detail in conjunction with the accompanying drawing, in which:

FIGURE 1*a* is a cross-sectional view of a solid state device embodying the invention, together with a suitable circuit for utilizing the device as an amplifier;

FIGURE 1*b* is a plan view of the device illustrated in FIGURE 1*a*;

FIGURE 3 is a plan view of a multiple array of electrical devices embodying the invention and connected in cascade on a single substrate;

FIGURES 4–8 are cross-sectional views of five other devices each embodying the invention;

Figure 11:
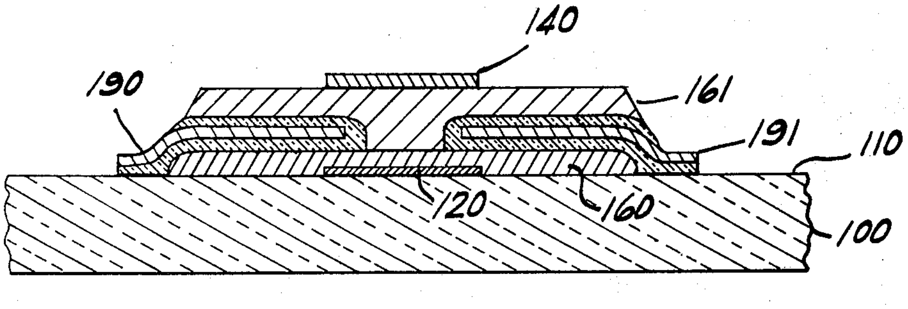
Figure 12:
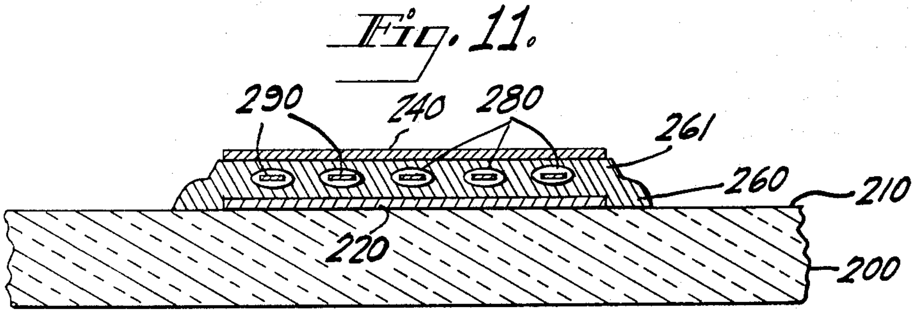
Figure 13:
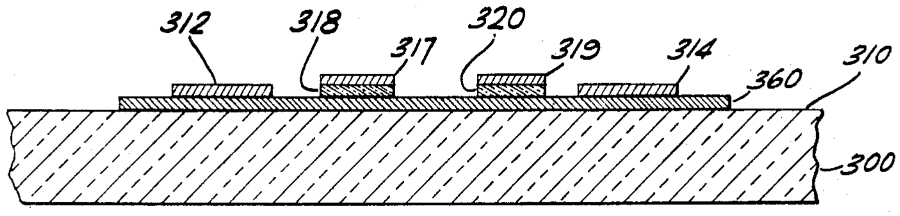
Figure 14:
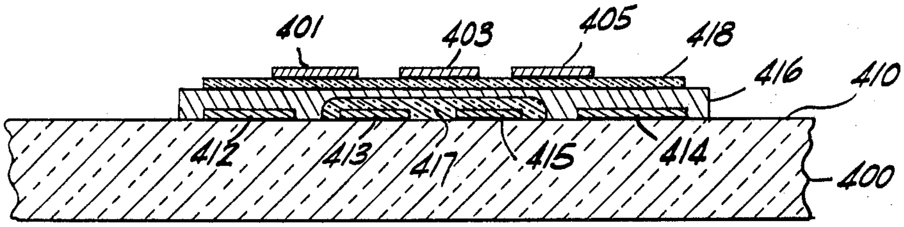
Figures 15A, 15B:
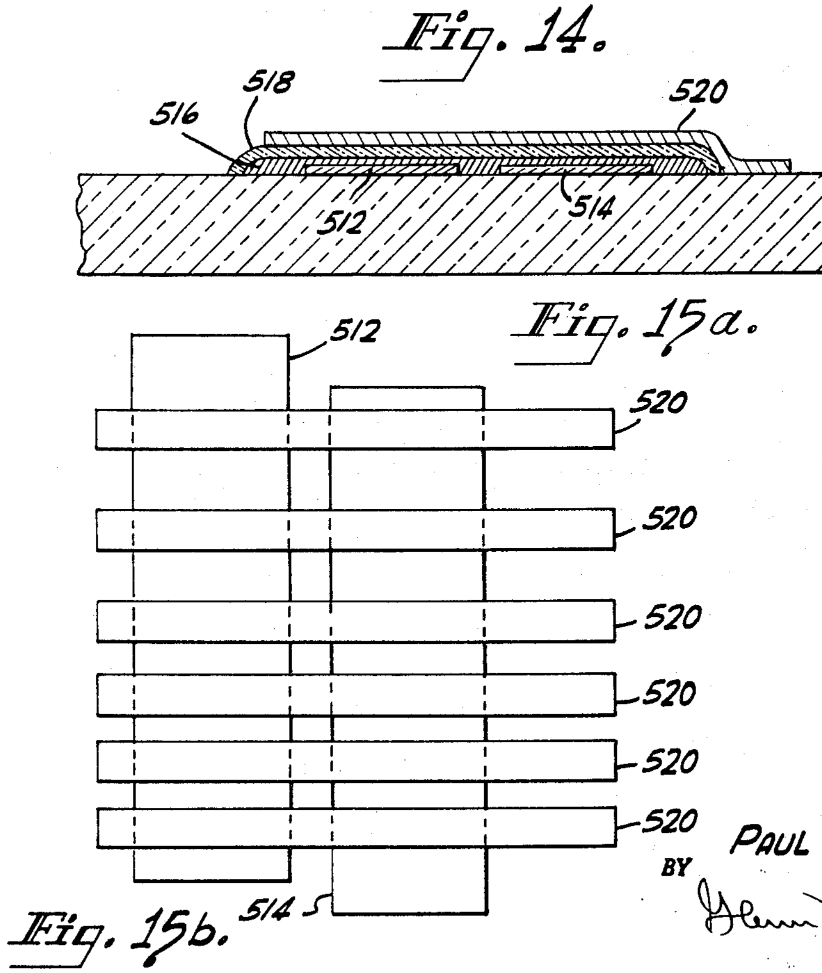

FIGURES 10*a*–10*d* are energy level diagrams useful in explaining the nature of an insulating contact used in practicing the invention;

FIGURES 11–12 are cross-sectional views of two other devices each embodying the invention;

FIGURES 13–15*a* are cross-sectional views of computer logic elements formed of thin film devices embodying the invention operating in the current enhancement mode; and FIGURE 15*b* is a plan view of the electrodes in the device of FIGURE 15*a*.

Similar reference numerals have been applied to similar elements in the drawing.

The nature of the insulating contact used as the control electrode in the devices of the invention is illustrated by the energy level diagrams of FIGURES 10*a* to 10*d* inclusive. An ohmic contact between a metal and a semiconductor is illustrated by the diagram in FIGURE 10*a*. An example of an ohmic metal-to-semiconductor contact is that between an electrode of lead-arsenic or lead-antimony alloy and N-type semiconductive germanium or silicon. Another example of such an ohmic-to-metal-to-semiconductor contact is that between an electrode of indium or gallium or aluminum and P-type semiconductive germanium or silicon. This type of contact is conductive for majority carriers in both directions, i.e., is conductive when the metal is biased positively and the semiconductor is biased negatively, and is also conductive when the metal is biased negatively and the semiconductor is biased positively.

Figure 10A:
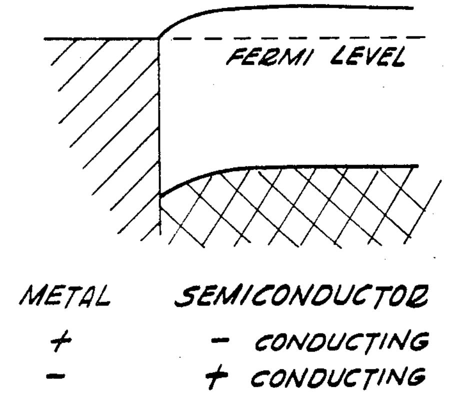
Figure 10B:
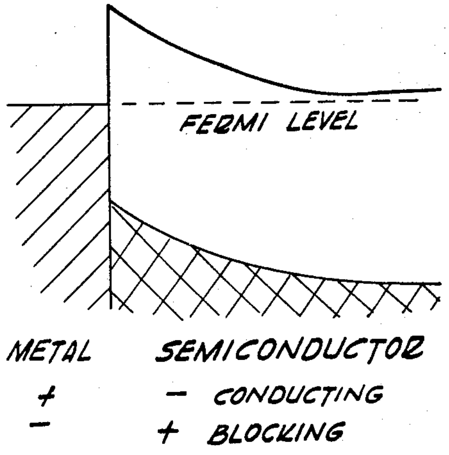

A rectifying contact between a metal and a semiconductor is illustrated by the diagram in FIGURE 10*b*. An example of such a rectifying metal-to-semiconductor contact is that between an electrode of indium or gallium or aluminum and N-type semiconductive germanium or silicon. Another example of a rectifying metal-to-semiconductor contact is that between an electrode of lead-arsenic or lead-antimony alloy and P-type semiconductive germanium or silicon. It is characteristic of such rectifying metal-to-semiconductor contacts that they are conducting if biased in one direction, and blocking if biased in the opposite direction. The contacts are conducting if the semiconductor is N-type and is negatively biased, or if the semiconductor is P-type and is positively biased. The contacts are blocking if the semiconductor is N-type and is positively biased, or if the semiconductor is P-type and is negatively biased.

Figure 10C:
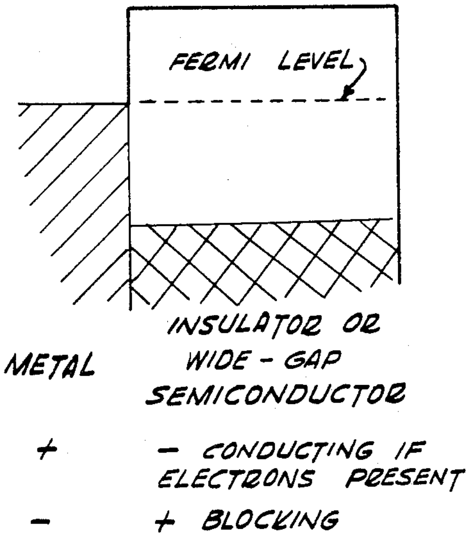

A contact between a metal and a wide-gap semiconductor or an insulator is illustrated in FIGURE 10*c*. Such a contact is blocking if biased with the metal negative and the insulator or wide-gap semiconductor positive. However, if the contact is biased so that the insulator or wide-gap semiconductor is negative, and if there are electrons present in the insulator or wide-gap semiconductor, then electrons will flow from the insulator to the metal.

Figure 10D:
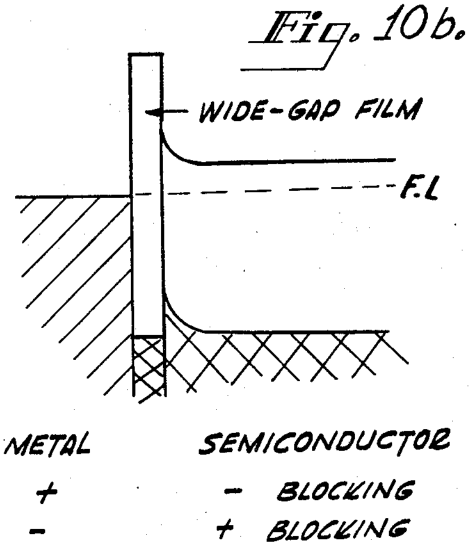

An insulating metal-to-semiconductor contact as utilized for the control electrodes of the devices according to the invention is illustrated in FIGURE 10*d*. Between the metal and the semiconductor there is interposed a thin film of wide-gap material, that is, of a high resistivity material having a band-gap wider than that of the semiconductor. This wide-gap film may consist of an insulator such as silicon dioxide, aluminum oxide, calcium fluoride or the like. The wide-gap film may also consist of a high-resistivity wide-gap semiconductor such as zinc sulfide when the active semiconductive layer of the device is a material such as germanium or the like which has a narrower band-gap than that of the wide-gap film. The bandgap of the wide-gap film must be sufficiently great that the barrier between the film and the semiconductor is too high for electron to be injected from the semiconductor into the conduction band of the film. The thin film of wide-gap material between the metal and the semiconductor therefore acts as a potential barrier, and blocks the flow of current from metal-to-semiconductor or from semiconductor-to-metal. No matter which way a bias is applied, a contact of this type is blocking, even though electrons may be present in the semiconductor. Such a metal-to-semiconductor contact, i.e., one having a thin film of wide-gap material between the metal and the semiconductor, is described hereinafter as an insulating contact.

EXAMPLE I

Figure 1A:
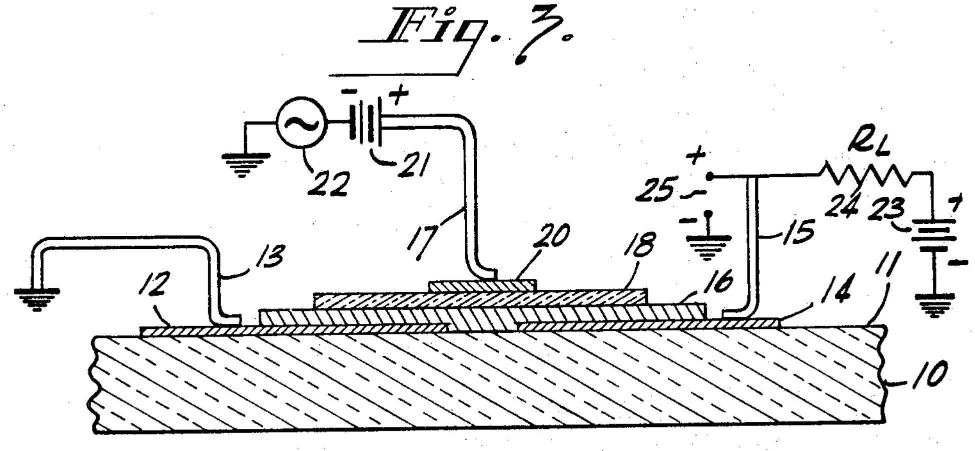
Figure 1B:
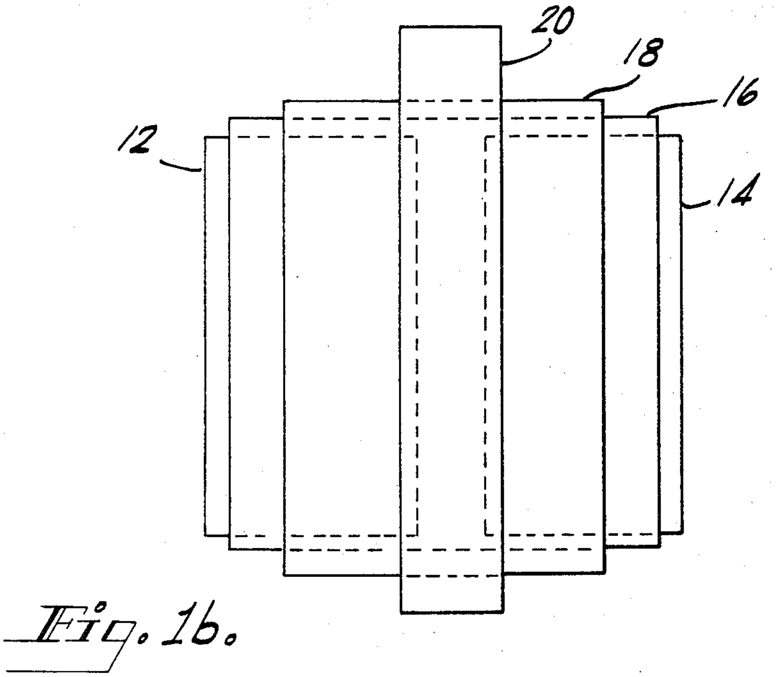

Referring now to FIGURE 1*a*, a solid state electrical device comprises an insulating support or substrate 10, such as a plate of glass, ceramic, fused quartz, or the like. In this example the insulating support 10 consists of glass. On one face 11 of substrate 10 are two spaced electrodes 12 and 14. Electrodes 12 and 14 suitably may consist of metals such as indium, gold, copper, and the like, and may be deposited as thin films by masking and evaporating techniques. Alternatively, a paste containing metallic particles may be painted or silk screened on the desired portions of face 11. Other techniques, such as sputtering, may also be utilized to deposit the electrodes as thin films. A layer 16 of semiconductive material is then deposited on the aforesaid face 11 of insulating support 10 and also so as to cover a portion of the two spaced electrodes 12 and 14. The semiconductive material is a crystalline substance which exhibits a periodic potential field, at least on an atomic scale, and may be either monocrystalline or polycrystalline. Suitable materials for the layer 16 include elemental semiconductors such as germanium, silicon, and germanium-silicon alloys; III–V compounds such as the phosphides, arsenides, and antimonides of aluminum, gallium, and indium; and II–VI compounds such as the sulfides, selenides, and tellurides of zinc and cadmium. Zinc oxide may also be classed as a II–VI compound. The energy gap and electrical resistance of some of the II–VI compounds is sufficiently high so that these materials may be regarded as insulators rather than semiconductors, and may be used as the wide-gap film for making insulating contacts on other semiconductors which have a smaller band gap. In this example, the semiconductor layer 16 consists of polycrystalline cadmium sulfide. The resistivity of cadmium sulfide may vary so widely that the material may be regarded as either a semiconductor or an insulator, depending on the method of preparation. However, the crystalline semiconductive material utilized is always one which exhibits a periodic potential field, at least on an atomic scale, and hence is suitable for the devices of this invention. A wide-gap film 18 is deposited on at least a portion of the semiconductor layer 16. Materials such as silicon monoxide, silicon dioxide, calcium fluoride, aluminum oxide, zinc sulfide, and the like, which materials have a wider band gap than the semiconductive layer 16, and exhibit high resistivity, have been found particularly suitable for wide-gap film 18. For efficient operation film 18 is preferably less than two microns thick. A control contact 20 on the wide-gap film 18 is opposite the gap or separation between the two spaced electrodes 12 and 14, as shown in FIGURE 1*b*. The separation between electrodes 12 and 14 is preferably less than 100 microns, and advantageously is of the order of 0.1 to 20 microns. The control contact 20 may suitably consist of a metal such as gold, aluminum, and the like, and may, for example, be deposited on wide-gap film 18 by masking and evaporation techniques. Electrical lead wires 12, 15, and 17 may be respectively attached, for example, by means of a metallic paste such as silver paste, to those portions of the two spaced electrodes 12 and 14 not covered with the layer 16, and to the insulating control electrode 20.

The device of the example may be utilized as an amplifier by incorporation in a suitable circuit, such as that shown in FIGURE 1*a*. Control contact 20 is positively biased by connecting lead wire 17 to the positive terminal of a voltage source, for example to the positive pole of a bias supply such as battery 21. The input voltage of the device is supplied by a grounded signal generator connected to negative pole of battery 21. One of the two spaced electrodes 12 and 14 is grounded. In this example, electrode 12 is grounded. Lead wire 15 is attached to a supply voltage, for example to the positive pole of a battery 23. The negative pole of battery 23 is grounded. A load resistance 24 is inserted between the positive pole of battery 23 and electrode 14. The output voltage may be measured by a voltmeter across terminals 25, that is, between lead wire 15 and the ground.

The device of the example, utilizing evaporated cadmium sulfide as the semiconductive layer 16, evaporated gold for electrodes 12, 14 and 20, and utilizing evaporated calcium fluoride for the wide-gap film 18 was operated with the control contact 20 at a positive bias of about 5 to 10 volts. The A.C. voltage gain of the device may be defined as the ratio of the output voltage to the input voltage. For input signals of about 50 millivolts, the device of this example exhibited voltage gains as high as 50 when the gap or separation between electrode 12 and electrode 14 was about 15 microns.

One feature of this embodiment of the invention is that the electrodes 12, 14 and 20, the semiconductor layer 16, and a wide-gap film 18 may all be deposited as thin films by evaporation or other suitable techniques. Satisfactory solid state devices fabricated entirely by the deposition of thin films have not hitherto been reported. Since various methods are known for the programmed control and monitoring of the deposition of successive layers of material, for example by evaporation techniques, the devices of this embodiment may be economically mass produced by automated equipment.

Another feature of this embodiment of the invention is that a rectifying barrier such as a PN junction is not required. The device operates by field effect control of majority carriers. The negatively biased spaced electrode 12 which is grounded may be termed the cathode electrode, the positively biased spaced electrode 14 may be termed the anode electrode, and the insulating contact 20 may be termed the control electrode. In this embodiment of the invention the cathode electrode 12 and the anode electrode 14 are both ohmic connections to the semiconductive cadmium sulfide layer 16. The control electrode 20 forms an insulating contact through the wide-gap film 18 to the semiconductor layer 16. That is, as discussed above, a contact which is blocking in both directions and hence cannot be considered as rectifying. In contrast, in a field effect unipolar transistor the gate electrode forms a PN junction adjacent the conductive channel between the source and the drain electrodes. A reverse bias is applied to the gate electrode of a unipolar transistor so that the width of the depletion layer associated with the PN junction increases, and thereby decreases the available charge carriers of the conductive channel between the source and the drain. In another field effect device known as a double base diode the PN junction adjacent the conductive channel between source and drain is biased in the forward direction thereby injecting charge carriers into the channel and increasing the conductivity of the channel. Thus, in both of these prior art field effect devices the control electrode or gate is necessarily associated with a PN junction, just as most solid state devices capable of exhibiting power gain include at least one rectifying barrier. In contrast, the device of this embodiment of the invention neither requires nor includes a rectifying barrier or a PN junction. Furthermore, most solid state devices require monocrystalline semiconductive material, whereas in contrast the semiconductive material in the devices according to the invention can be polycrystalline.

The mode of operation of this embodiment of the invention may be described as the current enhancement mode or the carrier enrichment effect. In order to operate the devices of the invention in the current-enhancement mode, it is necessary to have a control contact which can neither inject holes nor extract electrons from the semiconductor layer when the control contact is positively biased. This requirement is satisfied by making an insulating contact to the semiconductor layer, that is, by inserting a film of material having a bandgap wider than that of the semiconductor between the semiconductor layer and the control electrode. The wide-gap material may be an insulator such as silicon dioxide, calcium fluoride, aluminum oxide, and the like, or a high-resistivity wide-gap semiconductor such as zinc sulfide and the like.

Another requirement for operation in the current-enhancement mode is that the number of surface states at the input face between the control electrode and the semiconductive layer, or the number of traps in the interior of the semiconductor layer, must be sufficiently small that they can be filled by moderate positive bias on the control electrode without risking electric breakdown in the wide-gap film. If a large number of surface states or traps in the semiconductor layer remain unfilled, then any electrons drawn into the semiconductive layer from the input and output electrodes will be immediately trapped, and the net conductivity of the semiconductive layer will remain practically unchanged. However, if the positive bias on the control electrode is increased until all the surface states or traps are filled with electrons, then any further increase in the positive control bias will result in an increase of mobile charge carriers within the semiconductive layer in direct proportion to the applied signal voltage. It can be shown that when this condition is reached $$I_d = \frac{V_d \mu C \Delta V g}{\omega^2}$$

where $I_d$ is the output current, $V_d$ is the voltage on the anode or output electrode, $\mu$ is the mobility of the semiconductive layer, C is the capacitance of the wide-gap film between the control electrode and the semiconductive layer, $\omega$ is the gap width or separation between the anode and cathode electrodes.

The transconductance of the unit $$g_m \text{ is } \frac{V_d \mu C}{\omega^2}$$

from which it follows that the ratio of transconductance to capacitance $$\frac{g_m}{C} \text{ is } \frac{V_d \mu}{\omega^2} = \frac{1}{T}$$

where T is the transit time for charge carriers in the semiconductive layer between the anode and cathode electrodes.

In the device of Example 1, the semiconductive layer 16 is of N-type conductivity, so that the flow of current through the semiconductive layer is a flow of electrons from the cathode to the anode. Under these conditions, a positive bias is required on the control electrode to provide current enhancement. If the semiconductive layer 16 is of P-type conductivity, then the flow of current through the layer is a flow of holes from the anode to the cathode, and a negative bias is required on the ocntrol electrode.

In the operation of the device illustrated in FIGURE 1, the combination of the control electrode 20, the wide-gap film 18 and the semiconductive layer 16 acts as a parallel plate condenser. When a positive bias is applied to the control electrode 20 by the signal generator 22, the positive charge layer on the control electrode 20 attracts an equal negative charge layer on the portion of the surface of semiconductive layer 16 which is opposite control electrode 20. This negative charge layer consists of electrons drawn into semiconductive layer 16 from the electrodes 12 and 14. These electrons act as charge carriers to enhance the current which passes through the active layer 16 from input electrode 12 to output electrode 14. Units according to this embodiment of the invention have given tarnsconductance values up to 5,000 for an input capacitance of 300 micro-mhos. Measurements of the frequency versus capacitance indicate gain-bandwidth products of up to several megacycles for these devices.

Figure 2:
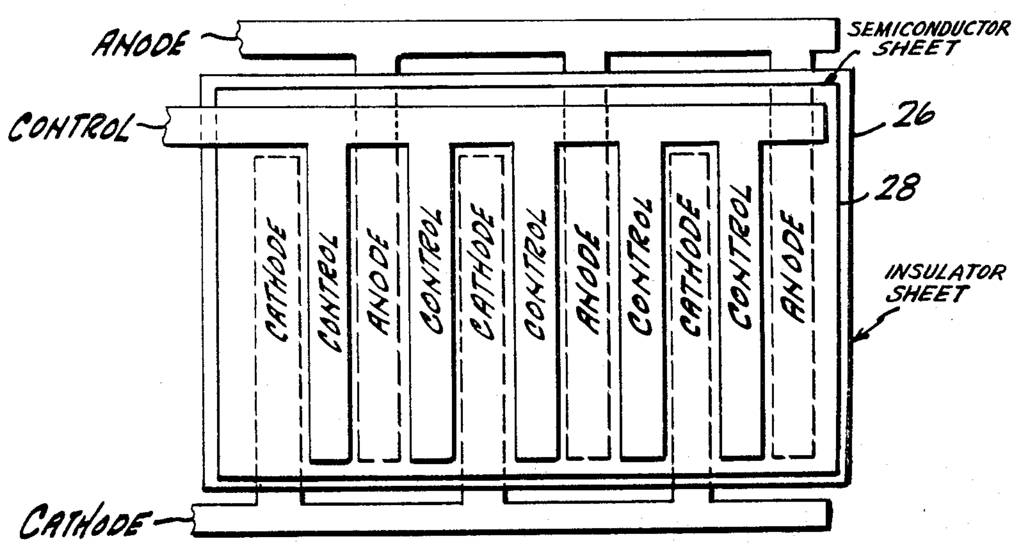
FIGURE 2 is a plan view of another electrical device embodying the invention.
Figure 7:
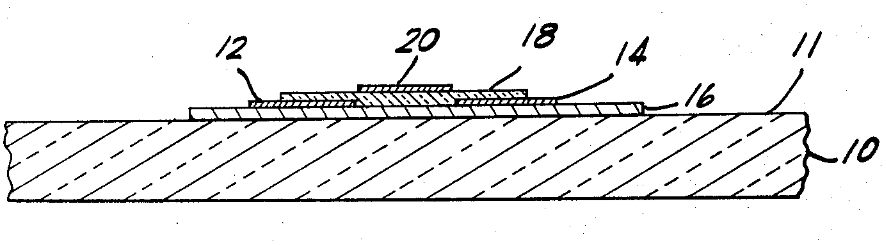
Figure 6:
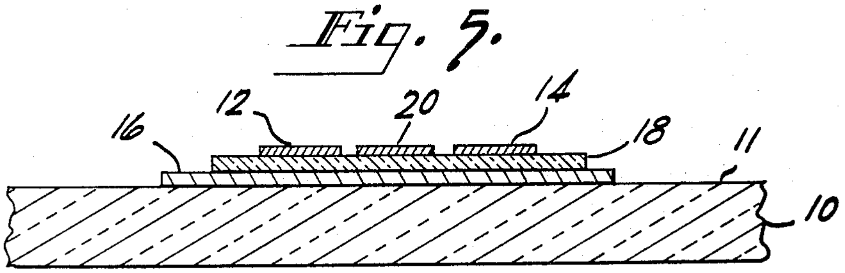

For greater clarity lead wires have not been shown in the plan views of FIGURES 1*b* and 2 nor in FIGURES 3–8, but it will be understood that each device is completed by attaching lead wires when necessary to the required electrodes.

Figure 9:
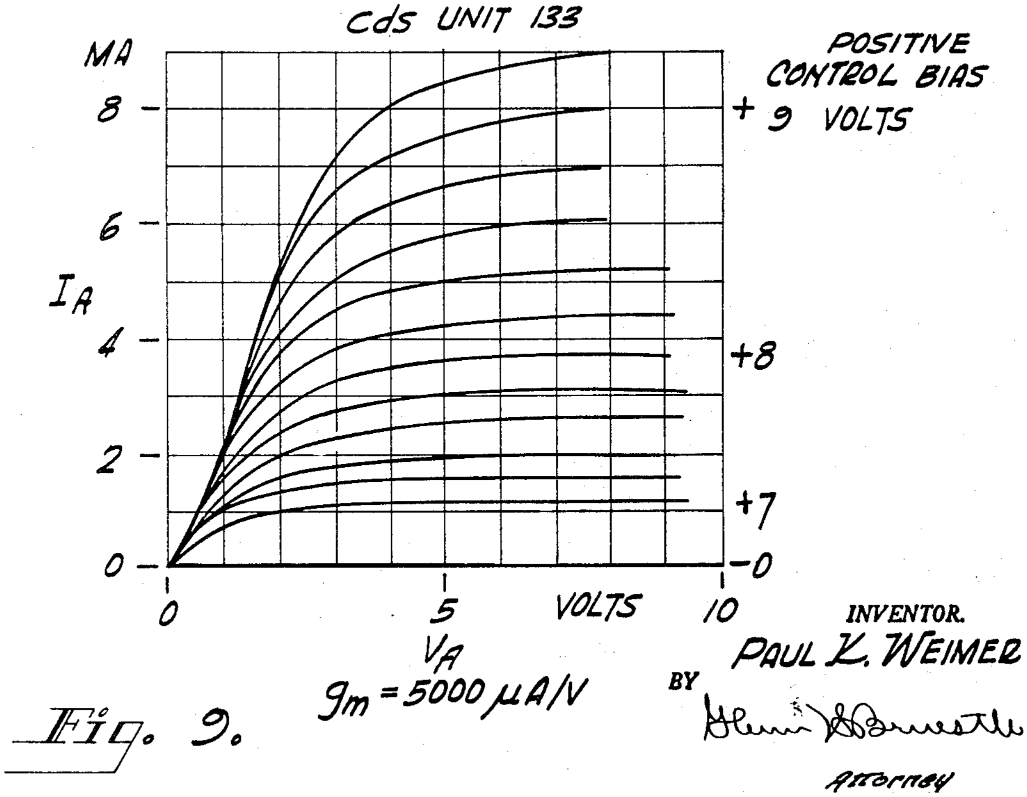
FIGURE 9 is a plot of the current-voltage curves for the device of FIGURES 1*a* and 1*b*.

FIGURE 9 is a plot of current versus voltage between the input and output electrodes for a device according to this embodiment operating in the current enhancement mode. The ordinate indicates output current as a function of the output voltage (with the input grounded) for different values of positive bias on the control electrode. Throughout the normal range the control electrode current is smaller than the output current by a factor 100 to 1,000. It will be noted that with increasing bias on the control electrode the output current remains small up to about a six volt bias, at which point the output current begins to rise rapidly. The transconductance of this unit at high gate bias is about 5,000 micro-mhos, and the voltage amplification factor is about 60. Power gains of about 5,000 have been obtained from devices according to this embodiment. No effect on the frequency response at high frequencies has been noted which could be related to the rates of filling or emptying of surface states or traps. It is therefore believed that under high positive bias conditions all of the electron traps have been filled so that a small further increase in control electrode potential is reflected directly in an increase of electrons in the conductive band. This suggests that the high frequency performance of devices according to the invention will not be seriously limited by trapping phenomena.

EXAMPLE II

In another embodiment of the invention the anode, cathode and control electrodes are prepared with a comb-like interdigitated structure, as shown in FIGURE 2. The layer of semiconductive material which is deposited on an insulating support or substrate may be one of the materials mentioned above, such as cadmium sulfide, cadmium selenide, gallium phosphide and the like. A wide-gap film 28 is deposited on a portion of one face of the active semiconductive layer 26 by any convenient technique, such as masking and evaporation. The comb-like anode and cathode electrodes are applied to that face of layer 26 which is opposite the wide-gap film 28. The anode and cathode electrodes may consist of a metal deposited by evaporation as described above. The control electrode may be of metal similarly applied to the wide-gap film 28 so that each finger of the control electrode is over the gap of separation between adjacent fingers of the anode and cathode electrodes. An advantage of this embodiment is that the increased size of the electrodes permits increased power handling capabilities.

EXAMPLE III

A plurality of field effect thin film triodes may be deposited on a single insulating substrate as illustrated in FIGURE 3. Suitable masking and evaporation techniques are utilized as described above to deposit on an insulating support 10′ a plurality of cathode electrodes 12′, a plurality of anode electrodes 14′, a semiconductive layer 16′ over the input and output electrodes, a wide-gap film 18′ on at least part of the active semiconductor layer 16′, and a plurality of control electrodes 20 on the wide-gap film 18′. Each control electrode 20′ is preferably positioned opposite the gap of separation between a cathode electrode 12′ and an anode electrode 14′. The individual triodes thus fabricated may be interconnected as desired, for example in cascade so that the output of one triode may be used to drive other triodes. In the device illustrated, there are three separate units interconnected in cascade so as to be operable as a three-stage amplifier. $R_{L1}$, $R_{L2}$, and $R_{L3}$ are strips of evaporated semiconductive material which serve as the load resistors for each triode.

EXAMPLE IV

Figure 4:
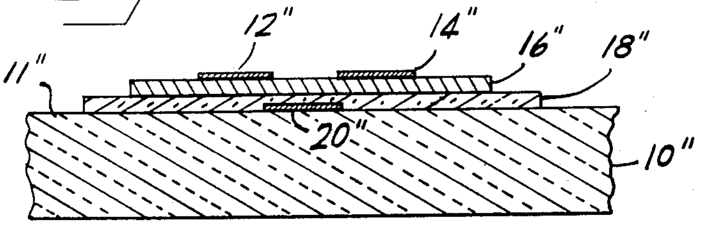
Figure 7:
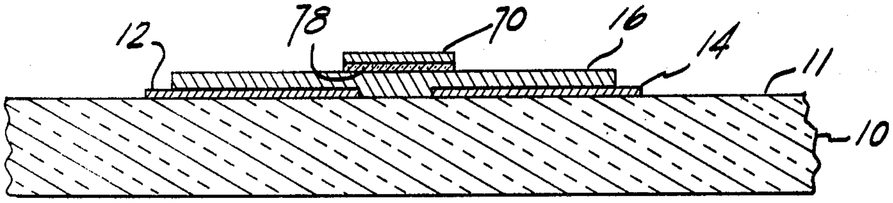

Another embodiment of the invention is illustrated in FIGURE 4. The field effect device of FIGURE 4 comprises an insulating substrate or support 10″, a metal control electrode 20″ on one face 11″ of support 10″, a wide-gap film 18″ over a portion of face 11″ and electrode 20″, a layer 16″ of crystalline semiconductive material on wide-gay film 18″, and metal cathode and anode electrodes 12″ and 14″ respectively on that face of the active semiconductor layer 16″ which is opposite the wide-gap film 18″. As in the remaining embodiments, the wide-gap film 18″ is preferably less than two microns thick. The gap or separation between the cathode and anode electrodes 12″ and 14″ is preferably co-axially opposite the control electrode 20″. It will be recognized that in the device of this example the actual arrangement of the cathode, anode and control electrodes with respect to the active semiconductor layer and the wide-gap film is similar to that of the device illustrated in FIGURE 1*a*, but with the insulating substrate supporting the control side of the device. Similarly, the other embodiments of the invention described herein may be fabricated by depositing the various layers in reverse order.

EXAMPLE V

Still another embodiment of the invention is illustrated in FIGURE 5. The thin film triode of FIGURE 5 comprises an insulating support 10; a layer 16 of active crystalline semiconductive material on one major face 11 of support 10; cathode and anode electrodes 12 and 14 respectively on that face of semiconductor layer 16 which is opposite the support 10; a wide-gap film 18 on a portion of layer of semiconductor layer 16 and electrodes 12 and 14; and a control electrode 20 on that face of film 18 which is opposite layer 16. The electrodes 12, 14, and 20 may, for example, be evaporated metal as described above, and are preferably arranged so that control electrode 20 is opposite the gap or separation between cathode electrode 12 and anode electrode 14. The device of this example differs from that of Example I in that in the latter the cathode and anode electrodes are positioned between substrate or support 10 and the semiconductor layer 16, while in the device of this example the cathode and anode electrodes are positioned between the active semiconductor layer 16 and the wide-gap film 18. All the electrodes of this embodiment are on the same side of the active layer 16, which is deposited first on the insulating support 10.

EXAMPLE VI

In another embodiment of the invention the three electrodes are also all on the same side of the device. The thin film triode shown in FIGURE 6 comprises an insulating support 10; a layer 16 of crystalline semiconductive material on one major face 11 of substrate 10; a wide-gap film 18 on at least part of layer 16; and a control electrode 20 between a cathode electrode 12 and an anode electrode 14 on that face of film 18 which is opposite layer 16. The insulating substrate or support 10 may consist of glass or fused quartz or a ceramic; the active semiconductor layer 16 may be any crystalline semiconductive material which exhibits a periodic electrical potential field on an atomic scale; the wide-gap film 18 may consist of any of the materials such as calcium fluoride and aluminum oxide mentioned in Example I; and the electrodes may consist of evaporated metal as described above. It will be noted that in this example the current passing into the active layer to and from the cathode and anode electrodes must tunnel through the wide-gap film 18, whereas this same film 18 must be sufficiently insulating to prevent the passage of current to the control electrode 20. To accomplish this, the film of wide-gap material may be made thicker beneath the control electrode 20 than beneath the cathode and anode electrodes 12 and 14.

*Methods of fabrication*

As mentioned above, the thin films utilized in the devices of the invention may be deposited by any convenient technique. While evaporation is presently the most useful method of depositing uniform thin films, other processes such as sputtering may also be utilized.

It can be shown that the upper limit on high frequency performance for the devices of the invention is related to the transit time for charge carriers moving in the active semiconductive layer between the cathode and anode electrodes. The transit time can be reduced either by increasing the mobility of the semiconductive layer, or by reducing the gap or spacing between the anode and cathode electrodes.

The narrow gap or separation between the cathode and anode electrodes can be precisely controlled in the following manner by a two-step evaporation process. A stretched wire held in a frame is utilized as an evaporation mask. The wire may, for example, be one mil thick. For high precision the stretched wire is preferably untwisted, and has been drawn through a die. A metal such as gold is then evaporated on an insulating support maintained beneath the wire. The support may, for example, be a glass slide. After the first evaporation step, there are formed on one face of the glass slide two gold films with a gap one mil wide between them. The frame is now moved a short distance transversely to the gap and parallel to the one face of the glass slide, by means of a precision screw. A second evaporation of gold on the glass slide is then performed. During the second evaporation some gold is deposited on a portion of the gap which was previously masked by the wire. The width of the gap can thus be reduced to an amount much less than the thickness of the stretched wire used as the mask. A gap or separation of as little as 1.0 micron can be attained between two evaporated electrodes in this manner. A frame holding a plurality of stretched wires may be utilized when a plurality of gaps is desired, as in the deposition of an array of devices on a single substrate. The method depends on imparting relative motion between the wire mask and the support. It may also be performed by keeping the frame and stretched wire in a fixed position, and moving the support or substrate relative to the wire. Alternatively, both the wire and the support may be moved.

A novel method of forming a thin wide-gap film between a metal and a semiconductor will now be described. This method has been found useful in fabricating the insulating contacts which serve as control electrodes for the devices of the invention. It has unexpectedly been found that when aluminum is deposited by evaporation under reduced atmospheric pressure onto a layer of semiconductor material, a thin film of aluminum oxide is formed between the deposited aluminum and the semiconductive material. While it is well-known that aluminum upon exposure to the air becomes covered with a thin film of aluminum oxide, it is somewhat surprising to find that such a film is formed on that surface of the deposited aluminum which is in intimate contact with the semiconductor layer, and hence is not directly exposed to the air. The aluminum is deposited at a reduced pressure of about $10^{-5}$ mm. Hg. It is thought that during the evaporation some of the aluminum molecules are able to combine with some of the oxygen molecules present and hence are deposited as aluminum oxide. It is estimated that the aluminum oxide film thus formed between the block of the evaporated electrode and the semiconductive layer is less than 100 Angstrom units in thickness. However this thin aluminum oxide film is capable of serving in the same manner as the thicker silicon dioxide or calcium fluoride films described above to prevent the flow of current in either direction between the aluminum and the semiconductor layer. An insulating contact which may serve as a control electrode in the devices of the invention is thus formed. It will be understood that an aluminum oxide film is also formed on that surface of the aluminum which is exposed to the air, but does not hinder the operation of the device, since electrical lead wires are readily attached to these exposed aluminum surfaces, for example by means of silver paste.

EXAMPLE VII

Figure 7:
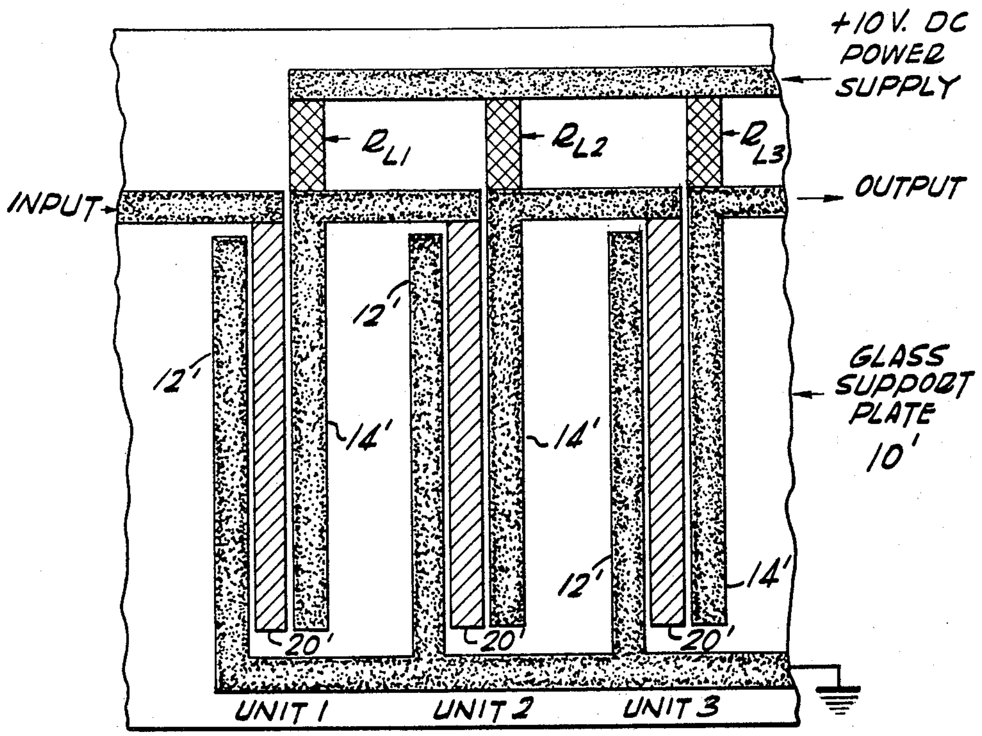

Another embodiment of the invention is illustrated in FIGURE 7. The field effect triode of the example comprises an insulating support 10; two closely spaced metallic electrodes 12 and 14 on one face 11 of support 10; and a layer 16 of active semiconductive material over at least part of face 11 and electrodes 12 and 14. A control electrode 70 is prepared by evaporating aluminum directly on layer 16 so that the resulting electrode is opposite the gap between cathode electrode 12 and anode electrode 14. As discussed above, it has been found that a very thin insulating film of aluminum oxide 78 is formed under these conditions between the aluminum control electrode 70 and the active semiconductor layer 16. This insulating aluminum oxide film is believed to be of the order of 30 Angstroms thick, but takes the place of the wide-gap film 18 in previous embodiments, and serves to prevent the control electrode 70 from injecting holes into the active semiconductor layer 16 or form extracting electrons from layer 16 when electrode 70 is positively biased.

EXAMPLE VIII

Figure 8:
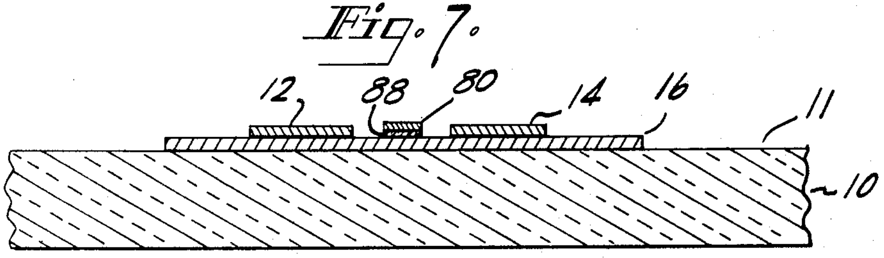

The thin film triode of this example has all three electrodes on the same side of the device as illustrated in FIGURE 8. The triode comprises an insulating support 10; a layer 16 of active semiconductor material on one major face 11 of support 10; a cathode electrode 12 and an anode electrode 14 on layer 16; and a control electrode 80 between cathode electrode 12 and anode electrode 14. The cathode and anode electrodes may consist of an evaporated metal such as indium, gallium, gold or the like. The control electrode 80 consists of evaporated aluminum. As in the previous example, a thin insulating film of aluminum oxide 88 is formed between the control electrode 80 and the active semiconductive layer 16. This insulating aluminum oxide film serves in the same manner as the wide-gap film 18 of previous embodiments to prevent excess current flow between control electrode 80 and layer 16 when control electrode 80 is positively biased.

In the examples described above the current flow in the semiconductor layer is substantially parallel to the plane of the semiconductor layer and the planar control electrode. In the two following examples, thin film triodes are described which operate in the current enhancement mode with the current flow substantially transverse to the plane of the thin films. These embodiments permit the gap between input and output electrodes to be determined by the thickness of the deposited films or layers, rather than by the critical positioning of laterally spaced electrodes. The conrtol electrode in these embodiments is apertured or perforated.

EXAMPLE IX

The thin film triode of this example comprises a metallic input electrode 120 deposited on major face 110 of insulating support 100, as illustrated in FIGURE 11. The electrode 120 may, for example, be a narrow strip of indium deposited by evaporation. A first layer of semiconductive material 160 is deposited, for example by evaporation, on at least part of electrode 120. Two aluminum control electrodes 190 and 191 are deposited on semiconductive layer 160 so that the aperture between these two control electrodes is opposite the cathode electrode 120. The aluminum electrodes 190 and 191 are deposited by evaporation under reduced atmospheric pressure, and, as described above, are surrounded by a thin insulating film 180 of aluminum oxide. If desired, the two aluminum electrodes 190 and 191 may be electrically connected externally by a connection not shown. A second layer 161 of the same semiconductive material previously used is now deposited on at least a portion of control electrodes 190 and 191 and over that portion of the first layer 160 which is exposed by the aperture between control electrodes 190 and 191. A metallic anode electrode 140 is then deposited on the second semiconductive layer 161 opposite the cathode electrode 120.

Alternatively, the control electrodes 190 and 191 may consist of evaporated gold or aluminum surrounded by an evaporated film 180 of an insulator such as calcium fluoride or silicon dioxide.

In the device of this embodiment the flow of charge carriers from the input electrode 120 to the output electrode 140 will tend to converge toward the aperture between the two control electrodes 190 and 191. The flow of current in the triode of this example is transverse to the plane of the thin films which constitute the device.

EXAMPLE X

The device of this embodiment comprises a metallic cathode electrode 220 deposited on major face 210 of insulating support 200, as illustrated in FIGURE 12. A first layer of semiconductive material 260 is deposited on at least part of electrode 220. A control grid or mesh 290 encased in an insulating coating 280 is then deposited on semiconductive layer 260. This may be accomplished by first evaporating a wide-gap material such as calcium fluoride in a predetermined grid or mesh pattern or layer 260, next evaporating narrower lines of a metal such as aluminum or gold on the same grid, and next evaporating another layer of the wide-gap material over the metal in the same grid or mesh pattern as before. Alternatively, the grid or mesh may be formed by depositing aluminum in the desired pattern on layer 260 under such conditions (for example, by evaporating the initial and final portions of the aluminum under reduced atmospheric pressure) that the deposited aluminum is coated with a thin insulating film 280 of aluminum oxide. A second layer 261 of the same semiconductive material as the first layer 260 is next deposited over the first layer 260 and at least part of the control grid 290. A metallic anode electrode 240 is then deposited on the second semiconductive layer 261. Preferably, anode electrode 240 is opposite cathode electrode 220.

The reduction in the spacing between the cathode and anode electrodes of the transverse current devices of this example and the previous example makes it possible to obtain higher ratios of transconductance to capacitance in these devices, and hence an improvement in the gain-bandwidth product.

The principles of the invention may also be utilized to form logic elements operable as computer building blocks. One type of logic element is the "and" gate. The following examples show how thin film "and" gates may be fabricated according to the invention.

EXAMPLE XI

A thin film "and" gate which operates in the current-enhancement mode comprises a layer 360 of one of the semiconductive materials mentioned above deposited on one major face 310 of an insulating support 300, as illustrated in FIGURE 13. Two spaced metallic electrodes 312 and 314 are deposited on the active semiconductive layer 360. Electrodes 312 and 314 may, for example, consist of indium or gold, and may be deposited by evaporation. Two spaced electrodes 317 and 319 insulated from the semiconductive layer 360 are formed in the gap or separation between electrodes 312 and 314. The two electrodes 317 and 319 may consist of aluminum deposited by evaporation under reduced atmospheric pressure so that thin insulating aluminum oxide films 318 and 320 are formed beneath electrodes 317 and 319, respectively. Alternatively, two spaced insulating films 318 and 320 of a wide-gap material such as calcium fluoride may be deposited in the gap between electrodes 312 and 314, and two gold films 317 and 319 subsequently deposited on wide-gaps 318 and 320, respectively.

The device thus formed may be operated as a simple "and" gate with two inputs. In order for the device to operate in the current-enhancement mode, both input gates 317 and 319 are positively biased in order for current to flow between the cathode electrode 312 and the anode electrode 314. Another form of this "and" gate with two input gates may be fabricated by forming the two insulating contacts 317 and 319 on opposite sides of the semiconductive layer.

EXAMPLE XII

A multiple input thin film "and" gate which can be fabricated by a series of five evaporation steps is illustrated in FIGURE 14. The device comprises an insulating support 400 having a plurality of spaced electrodes deposited on one major face 411 of the support. In this example, four spaced electrodes 412, 413, 415, and 414 are deposited on one major face 411 of insulating substrate 400. These electrodes may all consist of gold, and may be deposited simultaneously by a single evaporation step. Next, a first film 417 of a wide-gap material such as calcium fluoride or silicon monoxide is evaporated over at least part of the two electrodes 413 and 415. In the third evaporation step, a layer 416 of an active semiconductive material is deposited on at least part of the four electrodes 412, 413, 415 and 414 and the wide-gap film 417. In the fourth evaporation step, a second film 418 of wide-gap material such as zinc sulfide or calcium fluoride is deposited on at least part of the semiconductive layer 416. The fifth evaporation is the deposition of a plurality of metallic electrodes on the second wide-gap film 418. Material such as gold or aluminum are suitable for these electrodes. In this example, three such electrodes 401, 403 and 405 are deposited on a wide-gap film 418. It will be recognized that each of electrodes 401, 403, 405, 413 and 415 are separated from the semiconductive layer 416 by an insulating layer. Accordingly, when the device is operated in the current enhancement mode, and a steady current passed between electrode 412 and electrode 414, a positive bias is required on each of the electrodes 401, 403, 405, 413 and 415, which serve as multiple input gates, in order to obtain an enhanced output current.

In the "and" gates described above, the individual input gates operate in series on the same conductive paths between the input and output electrodes. Another important type of computer logic element known as the "or" gate may be fabricated as described below. In the "or" gate the individual input gates control parallel conductive paths between the input and output electrodes of the device.

EXAMPLE XIII

A multiple input thin film "or" gate in accordance with the invention is illustrated in FIGURES 15*a* and 15*b*. The device comprises an insulating support 500 bearing on one major face 511 two spaced electrodes 512 and 514. Electrodes 512 and 514 are preferably deposited in the form of long narrow parallel strips, as shown in the plan view of the device electrodes in FIGURE 15*b*. A layer of active semiconductive material 516 is deposited on at least part of electrodes 512 and 514. A film 518 of material having a bandgap greater than that of semiconductive layer 516 is deposited on at least part of layer 516. A plurality of metal electrodes 520 are then deposited on wide-gap film 518 transversely to electrode 512 and 514. In this embodiment, as shown in the plan view FIGURE 15*b*, six such electrodes 520 are deposited, for example by evaporation of gold or aluminum. It will be seen that the device can be fabricated by means of only four separate evaporation steps. Each of the six electrodes 520 is insulated from the semiconductive layer 516 by the wide-gap film 418. When this device is operated in the current-enhancement mode, and a small steady current is passed between cathode electrode 512 and anode electrode 514, the presence of a positive biasing on any one of the electrodes 420 is sufficient to enhance the current passing between the cathode and anode electrodes of the device.

The above examples are but illustrative, and various modifications may be made without departing from the spirit and scope of the invention. For example, although the cathode electrode preferably makes an ohmic contact to the active semiconductive layer in most embodiments, it is a tunneling contact in the device illustrated in FIGURE 6. It is not necessary that the anode electrode be an ohmic contact to the semiconductive layer. The anode electrode may make a tunneling contact or a forward biased rectifying contact to the semiconductive layer. If desired, devices according to the invention may be deposited on both of the opposing major faces of an insulating substrate or support.

There has thus been described an improved solid state electrical device capable of operating in the current enhancement mode, and improved methods of fabricating them.

What is claimed is:

1. The method of fabricating a solid state device comprising the steps of depositing two spaced metallic electrodes upon one major face of an insulating support by evaporation, utilizing a stretched untwisted wire mounted on a frame as an evaporation mask to form the gap between said two spaced electrodes; imparting relative motion between said frame and said support transversely to said gap and parallel to the plane of said major face for a distance less than the diameter of said wire; repeating the evaporation of said metallic electrodes so as to make said gap between said electrodes less than the diameter of said wire and less than one hundred microns; evaporating a layer of semiconductive material upon a portion of said spaced electrodes and said one major face; evaporating a film of high-resistivity material having a bandgap greater than said semiconductive material upon said layer; and evaporating upon said film a third metallic electrode, said third electrode being opposite said gap between said spaced electrodes.

2. The method of fabricating a solid state device comprising the steps of depositing two spaced metallic electrodes upon one major face of an insulating support by evaporation, utilizing a stretched untwisted wire mounted on a frame as an evaporation mask to form the gap between said two spaced electrodes; imparting relative motion between said frame and said support transversely to said gap and parallel to the plane of said major face for a distance less than the diameter of said wire; repeating the evaporation of said metallic electrodes so as to make said gap between said electrodes less than the diameter of said wire and less than 100 microns; evaporating a layer of semiconductive material upon a portion of said spaced electrodes and said one major face; and evaporating upon said layer an aluminum electrode under reduced atmospheric pressure to form an aluminum oxide film between said electrode and said layer, said electrode being opposite said gap.

References Cited

UNITED STATES PATENTS 3,138,850 6/1964 Loro et al. ---------- 117—212

WILLIAM L. JARVIS, *Primary Examiner*.